United States Patent [19]

Dobkin

[11] 3,978,322

[45] Aug. 31, 1976

[54] MEASUREMENT SYSTEM FOR TIMER

[75] Inventor: Robert C. Dobkin, Atherton, Calif.

[73] Assignee: National Semiconductor Corporation, Santa Clara, Calif.

[22] Filed: Sept. 30, 1974

[21] Appl. No.: 510,619

[52] U.S. Cl. .............................. 235/92 T; 58/50 R; 73/6; 235/92 FQ; 250/578; 315/241 S; 324/78 D; 324/181

[51] Int. Cl.[2] .................. G04C 19/02; G01R 23/06; G06F 7/56

[58] Field of Search........... 235/92 T, 92 ST, 92 TF, 235/92 V; 73/6, 432 R; 315/241 S, 149–151, 157; 58/50 R, 23 R, 23 A, 23 AC; 324/181, 182, 78 R, 78 D, 78 E, 78 Z; 250/552, 553, 578

[56] References Cited

UNITED STATES PATENTS

| | | | |
|---|---|---|---|
| 3,144,802 | 8/1964 | Faber, Jr. et al. | 324/78 D |
| 3,289,039 | 11/1966 | Stamm et al. | 235/92 V |
| 3,393,321 | 7/1968 | Frungel | 250/578 |
| 3,553,728 | 1/1971 | Frank et al. | 324/78 D |
| 3,747,323 | 7/1973 | Eckenrode | 58/50 R |
| 3,811,314 | 5/1974 | Anouchi | 73/6 |
| 3,846,972 | 11/1974 | Doss | 58/50 R |

*Primary Examiner*—Leo H. Boudreau
*Attorney, Agent, or Firm*—Lowhurst & Aine

[57] ABSTRACT

A system for measuring the accuracy of an internal timing source of a device having a light emitting display which is energized at a rate derived from the timing cycle of that timing source includes an optical pickup disposed for receiving light emission from one element of the display and generating a signal having the same frequency as the frequency of such light emission. In one embodiment, the pulses of that signal which occur within a given time period are counted and the number of such counted pulses is supplied to a display for human recognition. In a second embodiment, the time elapsed during one or more complete light emitting cycles is measured and displayed for human recognition. The pulses of a timing signal having a period of one microsecond which occur during one or more complete light emitting cycles are counted and the resultant count is displayed. A method includes the steps of comparing a time reference signal with a signal corresponding to the light emitting cycle of the light emitting display, determining the ratio of one parameter of the time reference signal to one parameter of the light emitting cycle, and displaying the value of either the ratio, a multiple of that ratio, or a submultiple of that ratio.

14 Claims, 2 Drawing Figures

MEASUREMENT SYSTEM FOR TIMER

BACKGROUND OF THE INVENTION

1. FIELD OF THE INVENTION

This invention relates generally to the measurement of the timing accuracy of a timing source, and more particularly to a method of and apparatus for measuring the accuracy of the internal timing source of a device having a light emitting display which is energized at a rate derived from the timing cycle of that source.

2. PRIOR ART

Many electronic systems employ alpha-numeric displays for providing an indication of the results of one or more operations of that system to an operator. For example, electronic timers and clocks may employ a numeric display for providing a visual presentation of elapsed time. Electronic calculator and computer systems employ such displays for human recognition of the results of certain arithmetic operations performed by such systems. The majority of these alpha-numeric displays are of the light emitting type in which one or more elements of the display are sequentially illuminated to create the required visually recognizable character field. It has been the practice with many of these displays to multiplex the energization of each element thereof at a frequency which is related to and derived from the basic time keeping reference of the system. Such a time keeping reference is generated by an internal timing or clock source of the system, such as quartz crystal oscillator.

It is often desirable to measure the accuracy or the error, if any, of the internal timing source of such a system. If the display of such a system is capable of providing a visual indication of elapsed time, such as in an electroncic time piece, the usual practice has been to permit the time piece to operate for a relatively long period of time and compare the elapsed time thereof with an accurate standard. Any difference found in the comparison of the two readings indicates, of course, the deviation of the internal timing source from its intended operation, thereby providing an indication of its accuracy. It can be readily appreciated that this method requires that the system which is being tested be operated for a relatively long period of time in order to determine the error which may exist with any degree of accuracy. For example, if the least significant digit of the display changes in one second intervals, and the timing source has an error of one microsecond, per second or $1\times10^{-4}$ percent, it will be necessary to operate the system for a period of approximately 12 days before a one second difference will exist between that display and the standard.

If the system display is not capable of indicating elapsed time, or if it is desirable to determine the error of the timing source in a relatively short period of time, it has been the practice to disassemble the system under test in order to gain direct access to the output of the timing source. Since the frequency of the internal timing source is usually much higher than the rate of change of the least significant digit of the associated display, such access permits measurement of the timing source error in considerably less time. Unfortunately, such disassembly of the system under test in order to gain access to the output of its internal timing source is often not easily accomplished, particularly in miniaturized systems.

SUMMARY OF THE INVENTION

It is, therefore, an object of the present invention to provide a method of and apparatus for measuring the accuracy or error of a timing source which is internal to a system having a light emitting display which is energized at a rate derived from the timing cycle of that source.

Another and related object of the present invention is to provide a method of and apparatus for measuring the accuracy or error of an internal timing source in such a system without disassembling the device to obtain access to the output of the timing source.

Still another and related object of the present invention is to provide a method of and apparatus for measuring the accuracy or error of an internal timing source in such a system in a relatively short period of time.

These and other objects of the present invention are attained by the machine implemented process, and the apparatus for performing the process, of observing the light emitting frequency of one element of a multiplexed light emitting display and comparing that frequency with a known time standard. More specifically, a two-level signal is generated having a frequency which is equal to the light emitting frequency of one element of a multiplexed display. Either the number of pulses in that signal which occur within a defined time span are counted or the time required for one or more of such pulses is measured to provide an indication of the frequency of the internal timing source.

The invention, however, as well as other objects, features and advantages thereof will be more fully realized and understood from the following detailed description, when taken in conjunction with the accompanying drawing, wherein:

DETAILED DESCRIPTION OF THE PREFERRED EMBODIMENT

Figure 1:
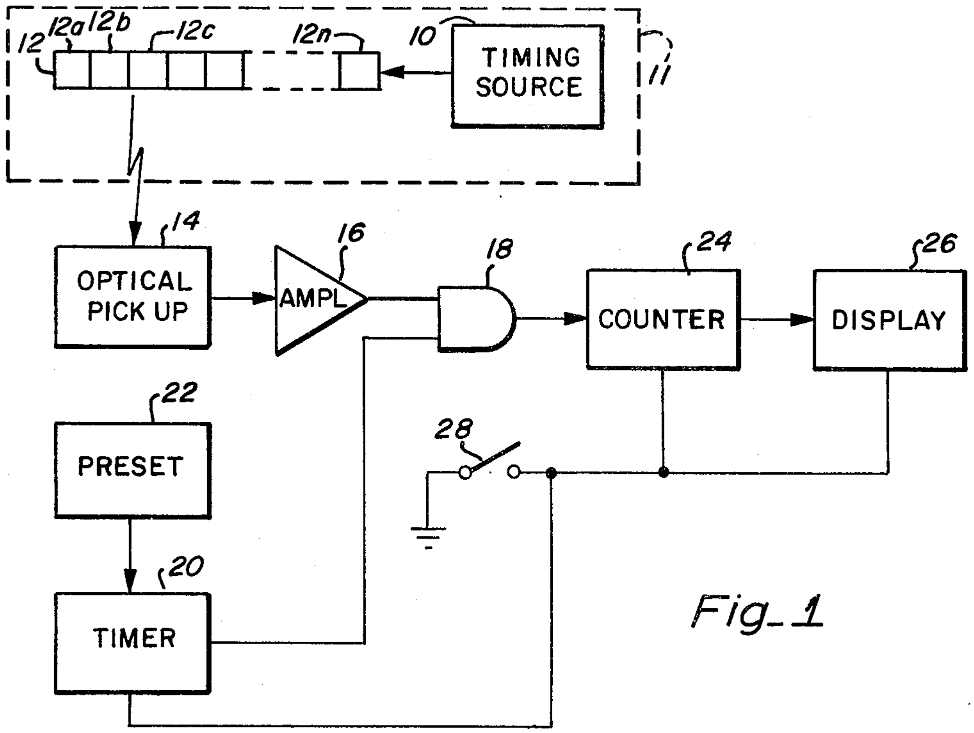
FIG. 1 is a partial block and partial logic diagram of one embodiment of the present invention.

With reference to FIG. 1, there is shown a system for measuring the accuracy or error of a timing source 10. The timing source 10 represents an internal timer or clock, such as a quartz crystal oscillator, of a system which is represented by a dotted line block designated with the reference numeral 11. The system 11 has a light emitting display 12 in which the individual elements 12*a–n* thereof are successively energized at a rate determined by the frequency of the timing source 10. That is, only one of the elements 12*a–n* of the display will be energized at any given time and all of the elements will be energized in succession. The display 12 may consist of any well known light emitting, alpha-numeric display, such as a light emitting diode display. In essence, the energization of each light emitting element 12*a–n* is multiplexed with the energization of the other elements. The multiplex rate is determined by the timing source 10 and may either be equal to the frequency of its output or a submultiple of the frequency of its output.

The present invention senses this multiplex rate and effectively compares it with a standard to provide an indication of the error, if any, of the frequency of the timing source 10. The multiplex rate or rate at which each of the individual elements 12*a–n* of the display 12 are energized is sensed by an optical pickup 14 which may consist of any known optical-to-electrical transducer. The optical pickup 14 is shown as being responsive only to the light emission of the element 12*a*. An output of the optical pickup 14 is a two-level signal wherein each pulse thereof corresponds to light emission from the element 12*a*. An output of the pickup 14 is supplied to an amplifier 16 in which the signal is appropriately amplified and the leading and trailing edges of the pulses thereof are appropriately shaped to provide relatively rapid transition from one level to the other level at an output thereof. The output of the amplifier 16 is supplied to one input of an AND gate 18 which has its other input connected to the output of a timer 20.

Preset logic circuit 22 is connected to the timer 20 and permits operator control of the timing interval of the timer 20. The timer 20 produces a two-level signal, with the duration of one level thereof corresponding to its time interval. In the embodiment illustrated in FIG. 1, the timer 20 produces a positive going pulse having a duration determined by the preset circuit 22 which enables the AND gate 18 to permit conduction of the pulses from the amplifier 16 therethrough.

An output of the AND gate 18 is connected to the input of a counter 24 which counts the pulses conducted through the AND gate 18. The numerical count contained in the counter 24 is displayed for human recognition by a display 26. Closure of a switch 28, which is connected to the timer 20, counter 24, and display 26, resets these units after one complete operating cycle of the system.

Assuming that each of the light emitting display elements 12*a–n* are energized at a rate of 1,000 Hertz, the frequency of the signal at the output of the amplifier 16 will also be 1,000 Hertz. If, for example, the timing interval of the timer 20 is set at one second by the preset logic circuit 22, the AND gate 18 will be enabled to permit 1,000 pulses at an output of the amplifier 16 to be conducted therethrough and counted by the counter 24. Since the contents of the counter 24 are displayed for human recognition by the display unit 26, at the end of the timing interval of the timer 20, the display unit 26 will indicate account of 1,000. However, if the timing source 10 has an error of 0.1 percent, such that the light emitting display element 12*a* is energized at a rate of 1,001 Hertz, and the timing interval of the timer 20 is set at one second, a count of 1,001 will be displayed by the display unit 26 at the end of one cycle of operation. Accordingly, it can be appreciated that such a 0.1 percent error can be detected with a system cycle duration of only one second. Therefore, a 0.01 percent error can be detected by setting the timing interval of the timer 20 to ten seconds.

Figure 2:
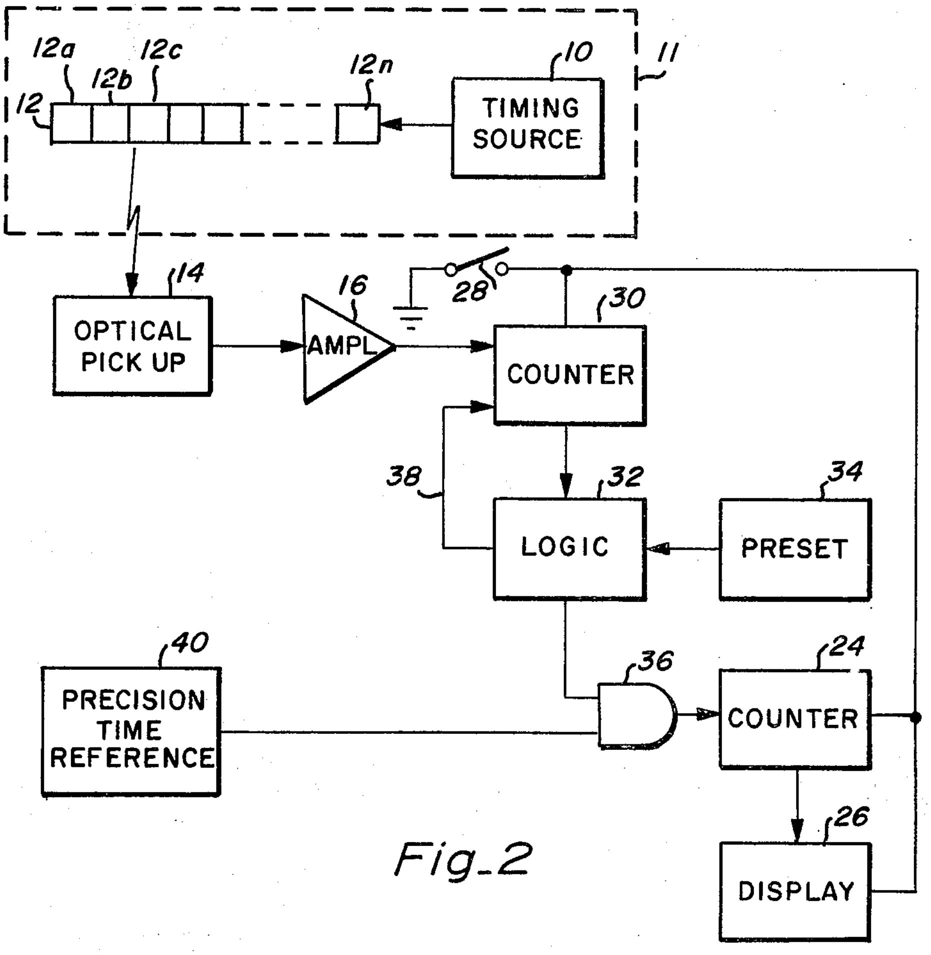
FIG. 2 is a partial block and partial logic diagram of a second embodiment of the present invention.

The embodiment illustrated in FIG. 1 effectively displays the frequency of the light emitting cycle of the display element 12*a*, or a multiple thereof, by counting and displaying the number of complete light emitting cycles thereof with occur within a given time period as determined by the timer 20. In the embodiment illustrated in FIG. 2, however, the display unit 26 displays a number corresponding to the inverse of the frequency of such cycles or the period thereof. In the embodiment of FIG. 2, the output of the amplifier 16 is supplied to a counter 30 having its outputs connected to the input of a logic circuit 32.

A preset circuit 43 permits operator control of the logic circuit 32 to select one or more of the first counting states of the counter 30 to provide a positive pulse at its output which is supplied to one input of AND gate 36. That is, the preset circuit 34 can be set to permit one or more of the first counting states of the counter 30 to generate an enabling signal to the AND gate 36. If, for example, the preset circuit 34 is set to a value of three, a positive output will be generated by the logic circuit 32 having a duration which is equal to three light emitting cycles of the element 12*a*. Under such conditions, the logic circuit 32 will generate a signal on a line 38 when the counter 30 attains a count of four to disable the counter 30 until it is reset. A precision time reference 40, of high accuracy, generates a two-level signal of relatively high frequency, such as 1 mega Hertz, and supplies that signal to the second input of the AND gate 36.

When the AND gate 36 is enabled by a positive signal from the logic circuit 32, the timing signal in the form of a train of pulses from the time reference 40 will be conducted therethrough to the input of the counter 24. The number of pulses, therefore, which are counted by the counter 24 during the period established by the preset circuit 34 will be displayed by the display unit 26. If the frequency of the time reference signal is 1 mega Hertz, the displayed number will be the number of microseconds which have elapsed suring the duration of one or more light emitting cycles of the element 12*a*. If, for example, the light emitting display 12 is multiplexed at a rate of 1,000 Hertz, the frequency of the time reference signal is 1 mega Hertz, and the preset circuit 34 is set to a value of ten, the display 26 will indicate a count of 10,000 at the end of one complete cycle of operation. However, if the timing source 10 has an error of 0.01 percent, the count displayed by the unit 26 will be either 9,999 or 10,001.

It can be appreciated that the illustrated and described measuring systems are capable of determining the error of the timing source 10 in a relatively short period of time and without disassembly of the device 11. It can also be appreciated that the measuring systems illustrated in FIGS. 1 and 2 are only exemplifications of the present invention and that the teachings of the present invention can be practiced with other combinations of components to achieve the same results. Accordingly, the present invention contemplates the method of measuring this error, by comparing the light emitting cycle of the multiplexed display 12 with a time standard, determining the ratio of the period or frequency of the light emitting cycle with the frequency or period, respectively, of a time standard signal, and displaying the value of either that ratio or a multiple of that ratio.

The invention claimed is:

1. A system for measuring the accuracy of the timing source of a device having a light emitting display which is formed of a plurality of light emitting elements which are energized successively at a rate derived from the timing cycle of that source, said system comprising a. transducer means responsive to only one of the light emitting elements for generating a signal having a parameter which is proportional to said rate of the light emission of that element.

b. timing means for generating a signal having its parameter which is proportional to time, and c. means responsive to said signals for determining the value of one of said parameters which accumulates during a time period which is proportional to the other of said parameter.

2. The system of claim 1, wherein said value of said one parameter is the frequency of the signal of said transducer means which is equal to said rate of the light emission of said one element.

3. The system of claim 1, wherein said value of said one parameter is a multiple of said rate of the light emission of said one element.

4. The system of claim 1, wherein said value of said one parameter is the period of the signal of said transducer means which is equal to the period of the light emitting cycle of said one element.

5. The system of claim 1, wherein said value of said one parameter is the multiple of the period of the light emitting cycle of said one element.

6. The system of claim 1, wherein the signal of said transducer means is a first two-level signal, with one level thereof having a duration which is proportional to the period of the light emitting cycle of said one element, wherein the signal of said timing means is a second two-level signal with one level thereof having a predetermined duration, and wherein said determining means includes means for counting the number of pulses which occur in one of said signals during the time which the other of said signals is at said one level thereof.

7. The system of claim 6, wherein said counting means includes a counter, means for supplying said first signal to an input of said counter when said second signal is at said one level, and means for displaying for human recognition an output of said counter.

8. The system of claim 7, wherein the predetermined duration of said one level of said second signal is adjustable.

9. The system of claim 6, wherein said timing means includes a clock source for generating said second signal, and wherein said counting means includes a first counter, means for supplying said second signal to an input of said first counter when said first signal is at said one level, and means for displaying for human recognition an output of said counter.

10. The system of claim 9, wherein said transducer means includes an optical-to-electrical transducer, a second counter connected to an output of said transducer, and means connected between an output of said second counter and an input of said supplying means for establishing said first signal at said one level thereof in response to a count within said second counter which is greater than zero and less than a predetermined value.

11. A method of measuring the accuracy of the timing source of the device having a light emitting display which is formed of a plurality of light emitting elements which are energized successively at a rate derived from the timing cycle of that source, said method comprising the steps of a. establishing a reference signal having a time related parameter, b. comparing the light emitting rate of only one of the light emitting elements of such a display with said parameter.

12. The method of claim 11, wherein said step of comparing includes the step of determining the value of said parameter which accumulates during a period equal to one complete light emitting cycle of said one element.

13. The method of claim 11, wherein said step of comparing includes the step of determining the value of said parameter which accumulates during a period equal to a multiple of a complete light emitting cycle of said one element.

14. The method of claim 11, wherein said step of comparing includes the step of counting the cycles of said rate of light emission of said one element which occur during the time established by said parameter.

* * * * *